US012646930B2

(12) United States Patent
Kim et al.

(10) Patent No.: US 12,646,930 B2
(45) Date of Patent: Jun. 2, 2026

(54) SEMICONDUCTOR DEVICES WITH VOLTAGE ADJUSTMENT

(71) Applicant: SAMSUNG ELECTRONICS CO., LTD., Suwon-si (KR)

(72) Inventors: Eonguk Kim, Suwon-si (KR); Chanhee Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 370 days.

(21) Appl. No.: 18/350,608

(22) Filed: Jul. 11, 2023

(65) Prior Publication Data

US 2024/0136811 A1 Apr. 25, 2024
US 2024/0235187 A9 Jul. 11, 2024

(30) Foreign Application Priority Data

Oct. 19, 2022 (KR) .......................... 10-2022-0135041
Jan. 11, 2023 (KR) .......................... 10-2023-0004139

(51) Int. Cl.
*H02H 9/04* (2006.01)
*H03K 19/0185* (2006.01)

(52) U.S. Cl.
CPC ....... *H02H 9/04* (2013.01); *H03K 19/018571* (2013.01)

(58) Field of Classification Search
CPC ............. H02H 9/04; H03K 19/018571; H03K 3/356182
USPC ................................................... 361/56, 91.5
See application file for complete search history.

(56) References Cited

U.S. PATENT DOCUMENTS

| | | | | |
|---|---|---|---|---|
| 5,280,200 A | * | 1/1994 | Tarng | H10D 84/00 |
| | | | | 257/E27.098 |
| 5,748,019 A | * | 5/1998 | Wong | H03K 19/0005 |
| | | | | 327/437 |
| 6,346,829 B1 | * | 2/2002 | Coddington | H03K 19/0027 |
| | | | | 326/83 |
| 8,531,230 B2 | * | 9/2013 | Kamimaru | H03K 5/003 |
| | | | | 365/189.11 |
| 9,184,735 B1 | | 11/2015 | Chen et al. | |

(Continued)

FOREIGN PATENT DOCUMENTS

| | | |
|---|---|---|
| CN | 203799408 U | 8/2014 |
| JP | 2007295209 A * | 11/2007 |

OTHER PUBLICATIONS

Partial European Search Report in European Appln. No. 23198527.6, mailed on Apr. 5, 2024, 18 pages.

*Primary Examiner* — Dharti H Patel
(74) *Attorney, Agent, or Firm* — Fish & Richardson P.C.

(57) ABSTRACT

A semiconductor device includes: a voltage clamping circuit including a plurality of first elements operating upon receiving a voltage having a first level and configured to output a clamp signal swinging in the first level by adjusting a voltage of an external input signal swinging in a second level more than twice the first level; a first buffer circuit configured to buffer the clamp signal; a level down shifter circuit configured to reduce the voltage of the clamp signal and output an internal input signal swinging in the first level between a predetermined reference voltage and a first power supply voltage higher than the reference voltage; and a second buffer circuit configured to buffer the internal input signal and transmits the internal input signal to a core circuit.

20 Claims, 8 Drawing Sheets

200

(56) References Cited

U.S. PATENT DOCUMENTS

| | | | |
|---|---|---|---|
| 9,484,897 B2 | 11/2016 | Green et al. | |
| 9,735,763 B1 | 8/2017 | Chen et al. | |
| 9,912,335 B2 | 3/2018 | Kapoor et al. | |
| 10,700,683 B1 * | 6/2020 | Chen | H03K 5/08 |
| 10,797,703 B2 * | 10/2020 | Peng | H03K 19/018521 |
| 2005/0270079 A1 * | 12/2005 | Chen | H03K 19/0027 |
| | | | 327/333 |
| 2005/0286333 A1 | 12/2005 | Gupta et al. | |
| 2009/0160523 A1 | 6/2009 | Rajagopal et al. | |
| 2010/0073074 A1 * | 3/2010 | Bertram | H03K 19/0013 |
| | | | 327/534 |
| 2012/0326753 A1 * | 12/2012 | Jao | H03K 5/08 |
| | | | 327/89 |
| 2015/0303906 A1 | 10/2015 | Chen et al. | |
| 2016/0105183 A1 * | 4/2016 | Kim | H03K 19/00315 |
| | | | 327/333 |
| 2016/0294372 A1 * | 10/2016 | Ebuchi | H03K 19/0175 |
| 2024/0312985 A1 * | 9/2024 | Song | H10D 84/676 |

* cited by examiner

10

100

400

400A

SEMICONDUCTOR DEVICES WITH VOLTAGE ADJUSTMENT

CROSS-REFERENCE TO RELATED APPLICATION(S)

This application claims the benefit of priority to Korean Patent Application Nos. 10-2022-0135041, filed on Oct. 19, 2022, and 10-2023-0004139, filed on Jan. 11, 2023, in the Korean Intellectual Property Office, the disclosures of which are incorporated herein by reference in their entirety.

BACKGROUND

The present disclosure relates to semiconductor devices.

Semiconductor devices include a plurality of semiconductor elements, and may include a receiving circuit and a transmitting circuit for exchanging signals with other external semiconductor devices. Recently, studies are being actively conducted to increase the degree of integration of semiconductor devices simultaneously with reducing power consumption thereof, and accordingly, the magnitude of a power supply voltage that can be input to each of semiconductor devices tends to decrease. Semiconductor devices may be implemented with semiconductor elements operating at a low power supply voltage, thereby lowering power consumption of the semiconductor device.

SUMMARY

An aspect of the present disclosure is to provide a semiconductor device that can receive and process a high voltage level signal transmitted by another external semiconductor device with only semiconductor devices operating at a low power supply voltage.

According to an aspect of the present disclosure, a semiconductor device includes: a voltage clamping circuit including a plurality of first elements operating upon receiving a voltage having a first level and configured to output a clamp signal swinging in the first level by adjusting a voltage of an external input signal swinging in a second level more than twice the first level; a first buffer circuit configured to buffer the clamp signal; a level down shifter circuit configured to reduce the voltage of the clamp signal and output an internal input signal swinging in the first level between a predetermined reference voltage and a first power supply voltage higher than the reference voltage; and a second buffer circuit configured to buffer the internal input signal and transmit the internal input signal to a core circuit.

According to an aspect of the present disclosure, a semiconductor device includes: a voltage clamp circuit configured to receive an external input signal and output a clamp signal by adjusting a voltage level of the external input signal; and a level down shifter circuit configured to output an internal input signal by adjusting a voltage level of the clamp signal, a maximum voltage level of the clamp signal is lower than a maximum voltage level of the external input signal, and a minimum voltage level of the clamp signal is higher than a minimum voltage level of the external input signal, and a swing level of the clamp signal is equal to a swing level of the internal input signal.

According to an aspect of the present disclosure, a semiconductor device includes: a receiving circuit connected to an input pad and configured to receive an external input signal through the input pad and generate an internal input signal by reducing a swing level of the external input signal and a maximum voltage level of the external input signal;

and a core circuit configured to receive the internal input signal, and a plurality of elements included in the receiving circuit and the core circuit include a gate insulating layer having the same thickness, and a maximum power supply voltage input to each of the plurality of elements is less than ½ of the swing level of the external input signal.

A semiconductor device according to some implementations of the present disclosure may receive an external input signal swinging at a relatively high voltage level from another external semiconductor device, and a voltage level at which the external input signal swings may be higher than a power supply voltage that can be input to each of the semiconductor elements included in the semiconductor device. The semiconductor device according to some implementations of the present disclosure may generate an internal input signal swinging in a low voltage range by clamping the external input signal and reducing a voltage level. Accordingly, a process for forming semiconductor elements included in the semiconductor device may be simplified, and power consumption of the semiconductor device may be reduced and the degree of integration may be improved.

Various useful advantages and effects may not be limited to the above-described effects, and may be more easily understood through a process in which specific implementations of the present disclosure are described.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, implementations of the present disclosure will be described with reference to the accompanying drawings.

Figure 1:
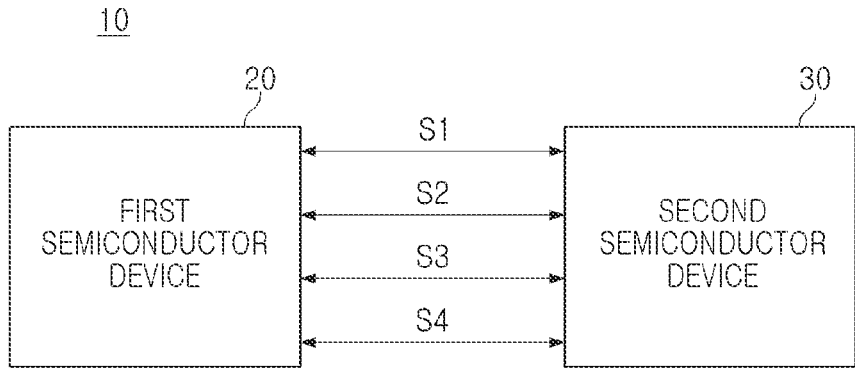
FIG. 1 is a block diagram schematically illustrating a system including a semiconductor device according to some implementations of the present disclosure.

FIG. 1 is a block diagram schematically illustrating a system including a semiconductor device according to some implementations of the present disclosure.

Referring to FIG. 1, a system 10 according to some implementations of the present disclosure includes a first semiconductor device 20 and a second semiconductor device 30, and the first semiconductor device 20 and the second semiconductor device 30 may transmit and receive a plurality of signals S1 to S4. For example, the first semiconductor device 20 may be a central processing unit, a system on chip, or an application processor (AP), and the second semiconductor device 30 may be a power supply device, a display driver, an input/output processing unit, or a memory device. In this case, the first semiconductor device 20 may control an operation of the second semiconductor device 30 with the plurality of signals S1 to S4.

For example, when the second semiconductor device 30 is a memory device, the first semiconductor device 20 may output a clock signal, a data signal, and a command/address signal to the second semiconductor device 30. The second semiconductor device 30 may perform a write operation of storing data included in the data signal received from the first semiconductor device 20 in response to the clock signal and the command/address signal. In addition, the second semiconductor device 30 may perform a read operation of reading data stored in response to the clock signal and the command/address signal and transmitting the data signal to the first semiconductor device 20.

According to some implementations of the present disclosure, elements (e.g., circuit elements such as transistors) included in the first semiconductor device 20 and elements (e.g., circuit elements such as transistors) included in the second semiconductor device 30 may be formed in processes of different scales. For example, the elements included in the first semiconductor device 20 operating as a main processor of the system 10 may have a smaller size as compared to the elements of the second semiconductor device 30 operating as the memory device. By implementing the first semiconductor device 20 with the smaller elements, the power consumed by the first semiconductor device 20 may be reduced and the degree of integration of the first semiconductor device 20 may be improved.

In addition, in some implementations of the present disclosure, in order to lower the manufacturing costs of the first semiconductor device 20, elements have gate insulating layers of the same thickness. For example, in some implementations, all elements (e.g., all transistors) included in the first semiconductor device 20 have a gate insulating layer of the same thickness. In such cases, a maximum magnitude of a power supply voltage that can be input to each of the elements of the first semiconductor device 20 may be limited to a predetermined first level. In addition, a swing level of a signal that the first semiconductor device 20 may receive from another external device, for example, the second semiconductor device 30, may also be limited to the first level.

However, according to various needs, the second semiconductor device 30 may output a signal swinging at a swing level higher than the first level to the first semiconductor device 20. For example, the input/output circuit of the second semiconductor device 30 may output a signal swinging at a level higher than the first level to the first semiconductor device 20 in order to improve signal integrity and data transmission speed. Accordingly, in the first semiconductor device 20, it is necessary to implement a circuit that may receive a signal swing at a swing level higher than the first level using only elements capable of receiving an input up to a power supply voltage at the first level.

In some implementations of the present disclosure, a circuit that may externally receive a signal swinging at a second level more than at most twice the first level may be implemented only with devices that may receive an input up to a power supply voltage having the first level. Accordingly, the first semiconductor device 20 may receive input signals that swing at various levels only with gate insulating layers having same thickness without a separate element capable of receiving a larger power supply voltage, including a gate insulating layer with a larger thickness. Therefore, it is possible to reduce the difficulty and costs of a process of manufacturing elements included in the first semiconductor device 20.

Figure 2:
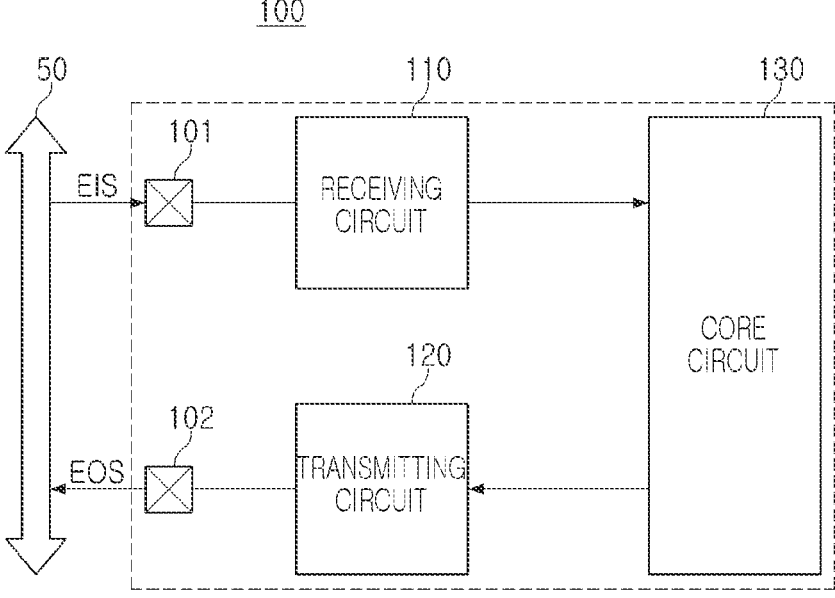
FIG. 2 is a block diagram schematically illustrating a system including a semiconductor device according to some implementations of the present disclosure.

FIG. 2 is a block diagram schematically illustrating an example of a system including a semiconductor device according to some implementations of the present disclosure.

Referring to FIG. 2, a semiconductor device 100 according to some implementations of the present disclosure may output or receive signals EIS and EOS through an external bus 50. For example, the semiconductor device 100 may receive an external input signal EIS from the bus 50 through an input pad 101 or output an external output signal EOS to the bus 50 through an output pad 102.

The semiconductor device 100 may include a receiving circuit 110, a transmitting circuit 120, and a core circuit 130. Each of the receiving circuit 110, the transmitting circuit 120 and the core circuit 130 may include a plurality of elements, and the core circuit 130 may include various circuits required for the semiconductor device 100 to provide a predetermined function, such as a central processing unit (CPU), a graphical processing unit (GPU), an image signal processor (ISP), a neural processing unit (NPU), a modem, and a cache memory.

The receiving circuit 110 may process the external input signal EIS received by the input pad 101 from the bus 50 and transmit an internal input signal to the core circuit 130. The transmitting circuit 120 may process the internal output signal received from the core circuit 130 to generate an external output signal EOS, and may output the generated external output signal EOS to the bus 50 through the output pad 102.

As described above with reference to FIG. 1, in some implementations of the present disclosure, elements included in the semiconductor device 100 may operate upon receiving a power supply voltage of the same magnitude. For example, the elements may be configured to receive the power supply voltage and to operate (e.g., without being damaged) based on the power supply voltage. In other words, a maximum size of the power supply voltage that can be input to the elements included in each of the receiving circuit 110, the transmitting circuit 120, and the core circuit 130 may be equally limited to a predetermined first level. Accordingly, when the external input signal EIS received by the receiving circuit 110 to the input pad 101 swings at a higher voltage level than the first level, at least some of the elements included in the receiving circuit 110 and/or the core circuit 130 may be damaged.

In some implementations of the present disclosure, the receiving circuit 110 may convert the external input signal EIS swinging at the higher voltage level than the first level into an internal input signal swinging within the first level. The receiving circuit 110 may be made up only of elements receiving a power supply voltage within the first level. Accordingly, it is possible to minimize the increase in the difficulty and costs of the process of manufacturing the semiconductor device 100, and improve universality of the semiconductor device 100 at the same time.

The receiving circuit 110 may include a voltage clamping circuit for reducing a swing level of the external input signal EIS, and a level down shifter circuit for lowering a voltage level of a signal output by the voltage clamping circuit and generating a signal swinging within the first level. For example, the voltage clamping circuit may generate a signal having a swing level lower than that of the external input signal EIS by increasing a minimum voltage level of the external input signal EIS and decreasing a maximum voltage level thereof. The level down shifter circuit may supply a signal swinging within the first level to the core circuit 130 by reducing each of a maximum voltage level and a minimum voltage level of a signal output by the voltage clamping circuit.

Figure 3:
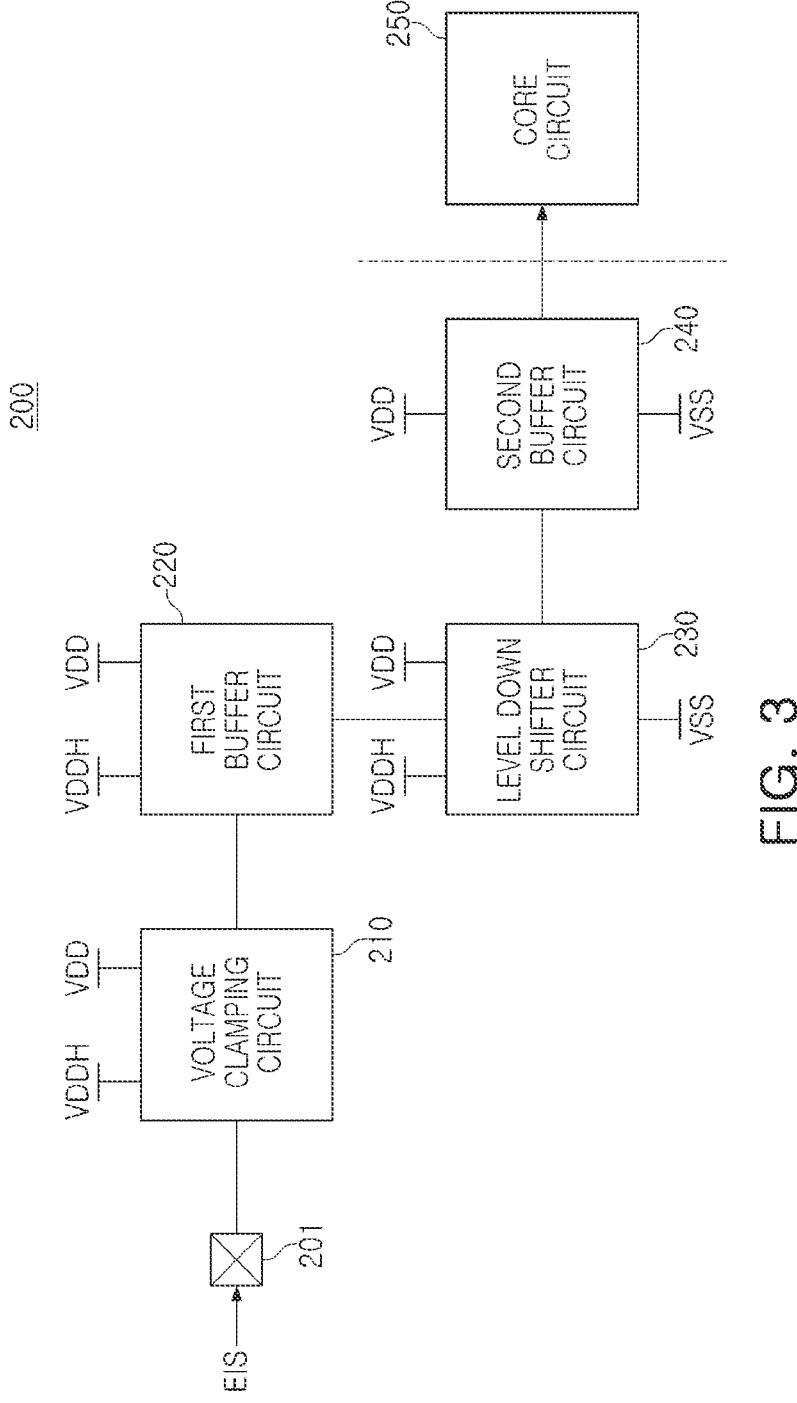
FIG. 3 is a block diagram schematically illustrating a system including a semiconductor device according to some implementations of the present disclosure.

FIG. 3 is a block diagram schematically illustrating a system including a semiconductor device according to some implementations of the present disclosure.

Referring to FIG. 3, a semiconductor device 200 according to some implementations of the present disclosure may include a voltage clamping circuit 210, a first buffer circuit 220, a level down shifter circuit 230, a second buffer circuit 240, and a core circuit 250. The voltage clamping circuit 210, the first buffer circuit 220, the level down shifter circuit 230, and the second buffer circuit 240 are connected between an input pad 201 and the core circuit 250 to supply a receiving circuit, and an internal input signal IIS may be output to the core circuit 250 by adjusting the swing level and voltage level of the external input signal EIS input to the input pad 201.

The voltage clamping circuit 210 may be connected to the input pad 201 to receive the external input signal EIS and reduce the swing level of the external input signal EIS. For example, the voltage clamping circuit 210 may generate a voltage clamping signal by reducing the swing level of the external input signal EIS by adjusting at least one of the maximum voltage level and the minimum voltage level of the external input signal EIS.

The voltage clamping circuit 210 may be implemented as a Schmitt trigger circuit or an inverter circuit having hysteresis characteristics. Referring to FIG. 3, a first power supply voltage VDD and a second power supply voltage VDDH are input to the voltage clamping circuit 210, and the second power supply voltage VDDH may have a higher level than the first power supply voltage VDD. According to some implementations of the present disclosure, a level of the second power supply voltage VDDH may be twice as high as a level of the first power supply voltage VDD, and may be less than a maximum voltage level of the external input signal EIS.

The semiconductor device 200 according to some implementations of the present disclosure may receive and use the power supply voltages VDD and VDDH having various levels from the outside. For example, the semiconductor device 200 may receive a third power supply voltage larger than the first power supply voltage VDD and the second power supply voltage VDDH, and a voltage generator inside the semiconductor device 200 may generate the second power supply voltage VDDH using the third power supply voltage and supply the second power supply voltage VDDH to the voltage clamping circuit 210. Alternatively, according to some implementations of the present disclosure, the semiconductor device 200 may externally receive both the first power supply voltage VDD and the second power supply voltage VDDH.

The first buffer circuit 220 may buffer the voltage clamping signal output by the voltage clamping circuit 210 and supply the buffered voltage clamping signal to the level down shifter circuit 230. The first buffer circuit 220 includes at least one inverter circuit, and elements included in the inverter circuit may receive the first power supply voltage VDD or the second power supply voltage VDDH.

The level down shifter circuit 230 may be a circuit for reducing a voltage level of a signal received from the first buffer circuit 220. For example, a reference voltage VSS may be further input to the level down shifter circuit 230 in addition to the first power supply voltage VDD and the second power supply voltage VDDH. The reference voltage VSS may be a voltage at a lower level than that of the first power supply voltage VDD, and a level difference between the reference voltage VSS and the first power supply voltage VDD may be equal to a level difference between the first power supply voltage VDD and the second power supply voltage VDDH. In this case, a level of the second power supply voltage VDDH may be twice as high as the level of the first power supply voltage VDD.

The second buffer circuit 240 may include at least one inverter circuit, and may buffer a signal output from the level down shifter circuit 230 to supply an internal input signal IIS to the core circuit 250. The elements included in the inverter circuit of the second buffer circuit 240 may receive the first power supply voltage VDD or the reference voltage VSS.

For example, a minimum voltage level of the internal input signal IIS may be equal to the reference voltage VSS, and a maximum voltage level thereof may be equal to the first power supply voltage VDD. Meanwhile, the minimum voltage level of the external input signal EIS may be equal to the reference voltage VSS, and the maximum voltage level thereof may be higher than the second power supply voltage VDDH. In other words, the receiving circuit may generate the internal input signal IIS by reducing the swing level and the maximum voltage level of the external input signal EIS, and transmit the internal input signal IIS to the core circuit 250.

In some implementations of the present disclosure, each of the elements included in the semiconductor device 200 may include an active region formed in a semiconductor substrate, a gate electrode layer, and a gate insulating layer disposed between the gate electrode layer and the semiconductor substrate (e.g., such that the element is a transistor), and the maximum power supply voltage that may be input to each of the elements may vary depending on the size and thickness of the gate insulating layer. For example, the maximum power supply voltage input to each of the elements may be 1.0 V or less.

All maximum power supply voltages that may be input to each of the elements included in the semiconductor device 200 according to some implementations of the present disclosure may be equal to each other. Accordingly, the difficulty of the process of manufacturing the elements of the semiconductor device 200 may be reduced, and the number of masks required for manufacturing the elements may be reduced to reduce manufacturing costs.

For example, the maximum power supply voltage input to each of the elements included in the semiconductor device 200 may be the first power supply voltage VDD. Accordingly, when the external input signal EIS swinging at a level having a maximum voltage level higher than the second power supply voltage VDDH is directly input to the semiconductor device 200, at least some of the elements included in the semiconductor device 200 may be damaged.

In some implementations of the present disclosure, in order to prevent the above-described problem, the internal input signal IIS may be generated by reducing the swing level and the maximum voltage level of the external input signal EIS in the receiving circuit connected between the input pad 201 and the core circuit 250 and may be transmitted to the core circuit 250. In addition, according to some implementations of the present disclosure, the elements included in the receiving circuit may be formed in the same process as the elements included in the core circuit 250 by limiting the power supply voltage input to each of the elements included in the receiving circuit to the first power supply voltage VDD.

For example, the first power supply voltage VDD and the second power supply voltage VDDH may be input to the voltage clamping circuit 210. In other words, a maximum level of the power supply voltage input to each of the elements included in the voltage clamping circuit 210 may be limited to a level difference between the second power supply voltage VDDH and the first power supply voltage VDD. The level difference between the second power supply voltage VDDH and the first power supply voltage VDD may be equal to the level of the first power supply voltage VDD. Accordingly, the elements of the voltage clamping circuit 210 may not be damaged even though the external input signal EIS swing at the level having the maximum voltage level higher than the first power supply voltage VDD is input.

Meanwhile, the first power supply voltage VDD, the second power supply voltage VDDH, and the reference voltage VSS may be input to the level down shifter circuit 230. In order to prevent damage of the elements included in the level down shifter circuit 230, the level down shifter circuit 230 may be implemented so that the second power supply voltage VDDH and the reference voltage VSS are not simultaneously input to each of the elements.

FIGS. 4 to 9 are diagrams schematically illustrating circuits included in a semiconductor device according to some implementations of the present disclosure.

Figure 4:
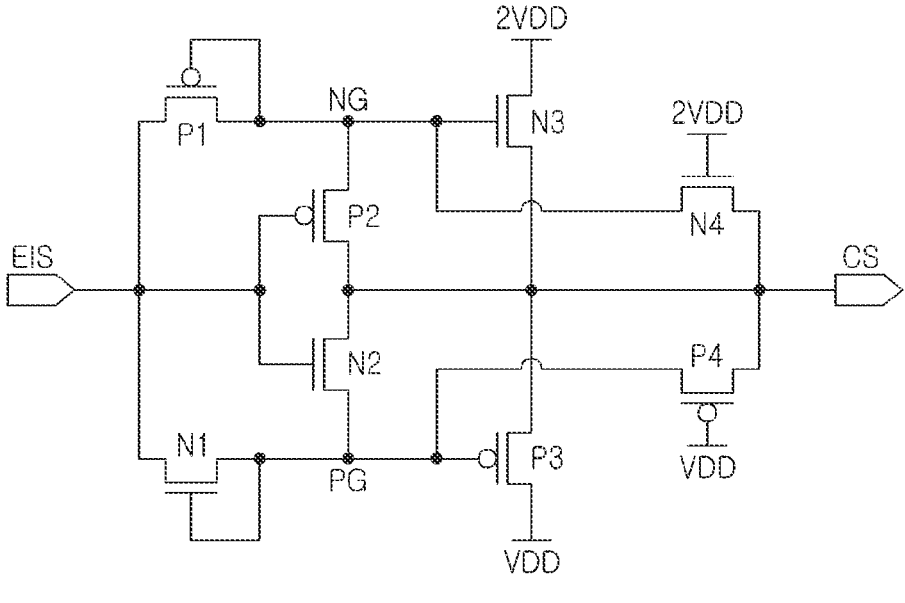
FIGS. 4 to 9 are diagrams schematically illustrating circuits included in a semiconductor device according to some implementations of the present disclosure.

First, FIG. 4 may be a circuit diagram illustrating a voltage clamping circuit included in the receiving circuit of the semiconductor device. Referring to FIG. 4, the voltage clamping circuit may include a plurality of first elements P1 to P4 and N1 to N4, some of the first elements P1 to P4 and N1 to N4 may receive a first power supply voltage VDD, and the others thereof may receive a second power supply voltage 2VDD. VDD and 2VDD may be provided, for example, on sources and/or drains of at least some of the elements P1 to P4 and N1 to N4. A level of the second power supply voltage 2VDD may be twice as high as the level of the first power supply voltage VDD. The plurality of first elements P1 to P4 and N1 to N4 may not be connected to (e.g., may be electrically disconnected from) and may be separated from nodes that transmit a reference voltage lower than the first power supply voltage VDD.

A node in which the first PMOS element P1 and the first NMOS element N1 are connected to each other may be connected to an input pad of the semiconductor device as an input node and may receive an external input signal EIS. The input node may be connected to input terminals of the second PMOS element P2 and the second NMOS element N2 implemented as an inverter circuit.

The third PMOS element P3 may be connected to a first power node outputting the first power supply voltage VDD, and the third NMOS element N3 may be connected to a second power node outputting the second power supply voltage 2VDD. A maximum voltage level and a minimum voltage level of the clamp signal CS output by the voltage clamping circuit may be determined according to the sizes of the first power supply voltage VDD and the second power supply voltage 2VDD input to the third PMOS element P3 and the third NMOS element N3.

The fourth NMOS element N4 may be connected between a first gate node NG to which a gate of the third NMOS element N3 is connected and an output node to which the clamp signal CS is output, and a gate of the fourth NMOS element N4 may be connected to the second power node. Meanwhile, the fourth PMOS element P4 may be connected between a second gate node PG to which the gate of the third PMOS element P3 is connected and the output node, and the gate of the fourth PMOS element P4 may be connected to the first power node.

According to some implementations of the present disclosure, a minimum voltage level of the external input signal EIS may be lower than the first power supply voltage VDD, and the maximum voltage level may be higher than the second power supply voltage 2VDD. When a voltage level of the external input signal EIS increases to input a higher voltage than the second power supply voltage 2VDD to the first gate node NG, the third NMOS element N3 may be turned on and the fourth NMOS element N4 may be turned off. As the third NMOS element N3 is turned on, a voltage level of the clamp signal CS may be set to the second power supply voltage 2VDD. Accordingly, even when a voltage level of the external voltage signal EIS increases to be higher than the second power supply voltage 2VDD, a maximum voltage level of the clamp signal CS may be limited to the second power supply voltage 2VDD.

Meanwhile, when the voltage level of the external input signal EIS decreases to input a voltage lower than the first power supply voltage VDD to the second gate node PG, the third PMOS element P3 may be turned on and the fourth PMOS element P4 may be turned off. As the third PMOS element P3 is turned on, the voltage level of the clamp signal CS may be set to the first power supply voltage VDD. Accordingly, even when the voltage level of the external voltage signal EIS decreases to be lower than a level of the first power supply voltage VDD, the minimum voltage level of the clamp signal CS may be limited to the first power supply voltage VDD.

In this manner, the voltage clamping circuit may adjust the swing level of the external input signal EIS swinging at a level having a minimum voltage level lower than the first power supply voltage VDD and a maximum voltage level higher than the second power supply voltage 2VDD. The voltage clamping circuit may output the clamp signal CS swinging between the first power supply voltage VDD and the second power supply voltage 2VDD by reducing the swing level of the external input signal EIS. Since a voltage level input to each of the plurality of first elements P1 to P4 and N1 to N4 included in the voltage clamping circuit (e.g., the voltage level provided on gates of the elements P1 to P4 and N1 to N4) may not exceed the first power supply voltage VDD, gate insulating layers included in each of the plurality of first elements P1 to P4 and N1 to N4 may have the same thickness. In addition, the sizes of each of the plurality of first elements P1 to P4 and N1 to N4 may be equal to those of individual elements included in the core circuit, and the thicknesses of the gate insulating layers of the individual elements included in the core circuit may be equal to those of the gate insulating layers of each of the plurality of first elements P1 to P4 and N1 to N4.

Figure 5:
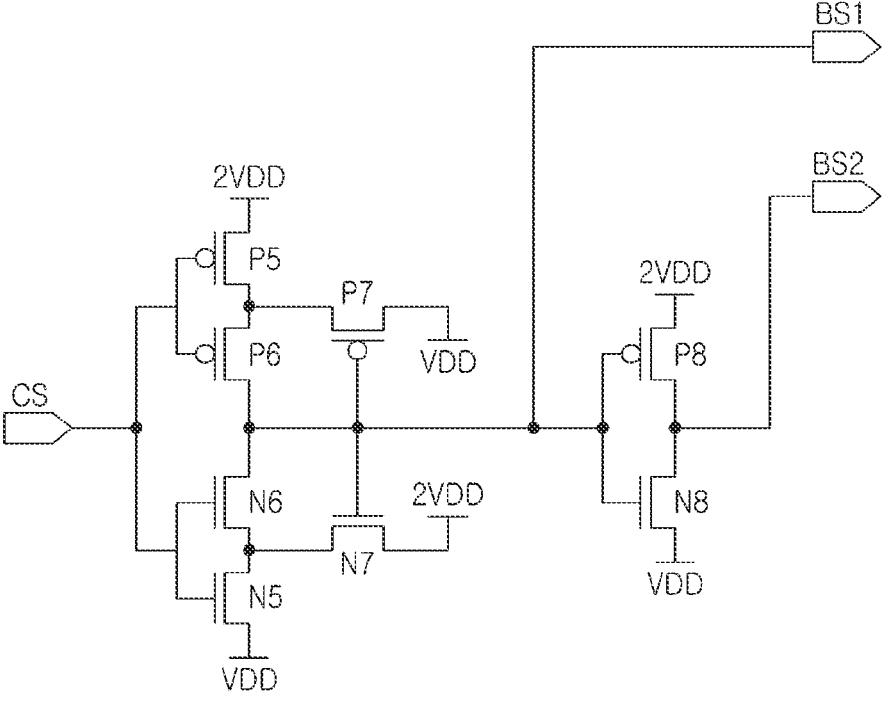

FIG. 5 may be a circuit diagram schematically illustrating a first buffer circuit receiving the clamp signal CS from the voltage clamping circuit. Referring to FIG. 5, the voltage clamping circuit may include a plurality of second elements P5 to P8 and N5 to N8, and some of the plurality of second elements P5 to P8 and N5 to N8 may receive a first power supply voltage VDD, and the others thereof may receive a second power supply voltage 2VDD higher than the first power supply voltage VDD. VDD and 2VDD may be provided, for example, on sources and/or drains of at least some of the elements P5 to P8 and N5 to N8. Like the plurality of first elements P1 to P4 and N1 to N4, the plurality of second elements P5 to P8 and N5 to N8 may also be separated from a node for transmitting a reference voltage lower than the first power supply voltage VDD.

The fifth PMOS element P5, the sixth PMOS element P6, the fifth NMOS element N5, and the sixth NMOS element N6 may be connected in series to supply a first inverter circuit. The fifth NMOS element N5 may be connected to a first power node for supplying the first power supply voltage VDD, and the fifth PMOS element P5 may be connected to a second power node for supplying the second power supply voltage 2VDD. The seventh PMOS element P7 may be connected to the first power node and a node between the fifth PMOS element P5 and the sixth PMOS element P6, and the seventh NMOS element N7 may be connected to the second power node and a node between the fifth NMOS element N5 and the sixth NMOS element N6. The eighth PMOS element P8 connected to the second power node and the eighth NMOS element N8 connected to the first power node may supply a second inverter circuit. As illustrated in FIG. 5, the number of elements included in the first inverter circuit may be greater than the number of elements included in the second inverter circuit.

As described above with reference to FIG. 4, the clamp signal CS may be a signal swinging at a level between the first power supply voltage VDD and the second power supply voltage 2VDD. The clamp signal CS may be input to the first inverter circuit. When the clamp signal CS increases, the fifth NMOS element N5 and the sixth NMOS element N6 may be turned on to output the first power supply voltage VDD to a first buffer signal BS1. Meanwhile, a second buffer signal B S2 having an opposite phase to that of the first buffer signal BS1 may be output by the second inverter circuit supplied by the eighth PMOS element P8 and the eighth NMOS element N8.

For example, the first buffer signal BS1 may have the same phase as the clamp signal CS, and the second buffer signal B S2 may have an opposite phase to that of the clamp signal CS. Each of the first buffer signal BS1 and the second buffer signal BS2 may be output to the level down shifter circuit. The plurality of second elements P5 to P8 and N5 to N8 included in the first buffer circuit may also operate upon receiving a voltage at a voltage level that does not exceed the first power supply voltage VDD. For example, gate voltages at the elements P5 to P8 and N5 to N8 may be maintained below VDD. Accordingly, the first buffer circuit may be implemented as an element having a gate insulating layer having the same size and thickness as elements included in the core circuit.

Figure 6:
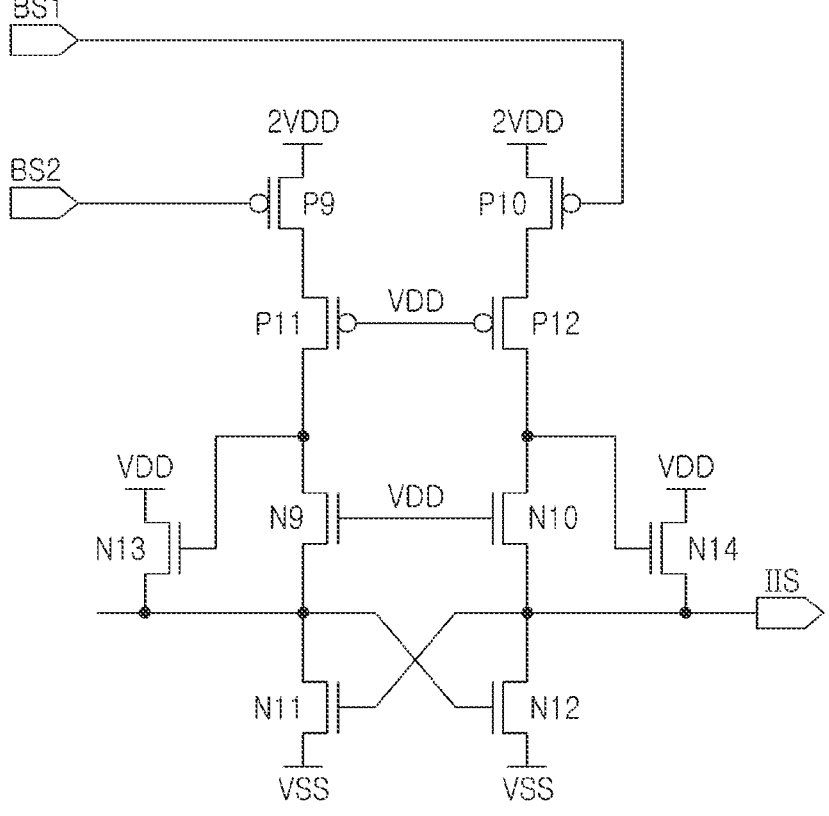
Figure 7:
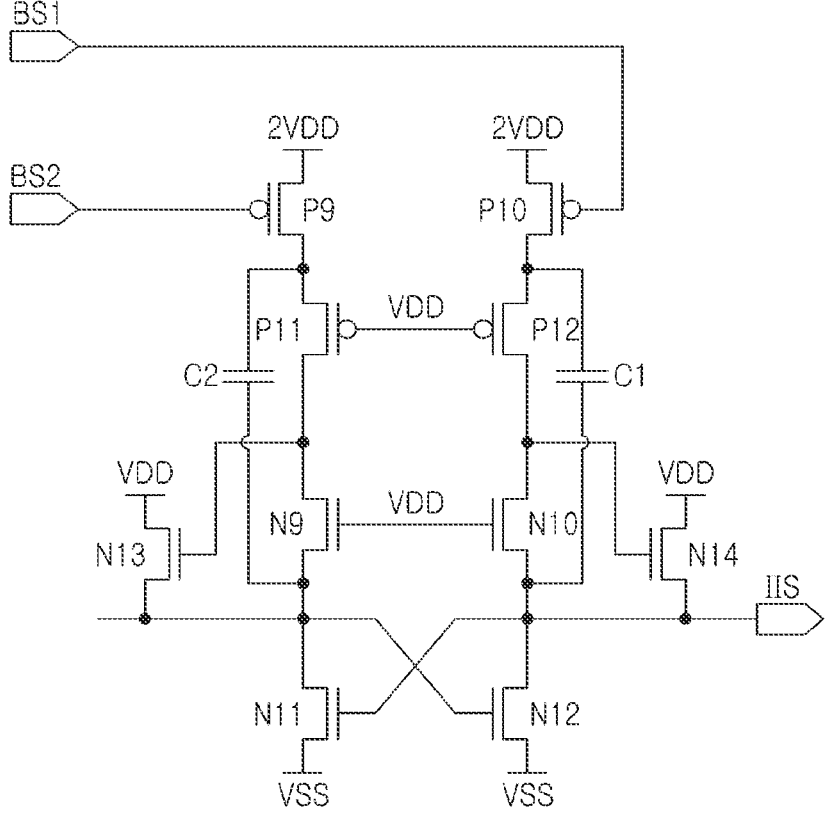

FIGS. 6 and 7 may be circuit diagrams simply illustrating the level down shifter circuit included in the receiving circuit according to some implementations of the present disclosure. Referring to FIGS. 6 and 7, the level down shifter circuit may include a plurality of third elements P9 to P12 and N9 to N14. Some of the plurality of third elements P9 to P12 and N9 to N14 may receive a first power supply voltage VDD, others may receive a second power supply voltage 2VDD higher than the first power supply voltage VDD, and the others may receive a reference voltage VSS lower than the first power supply voltage VDD. VDD, 2VDD, and VSS can be provided, for example, on sources and/or drains of at least some of the elements P9 to P12 and N9 to N14. Accordingly, the number of voltages input to the level down shifter circuit may be greater than the number of voltages input to each of the voltage clamping circuit and the first buffer circuit.

The ninth PMOS element P9 may be connected in series with the eleventh PMOS element P11 and may receive a second power supply voltage 2VDD. Meanwhile, the tenth PMOS element P10 may be connected in series with the twelfth PMOS element P12 and may receive the second power supply voltage 2VDD. The second buffer signal BS2 may be input to a gate of the ninth PMOS element P9, the first buffer signal BS1 may be input to a gate of the tenth PMOS element P10, and the first power supply voltage VDD may be input to gates of the eleventh PMOS element P11 and the twelfth PMOS element P12. For example, when the ninth PMOS element P9 is turned on by the second buffer signal BS2, the eleventh PMOS element P11 may be turned on, and when the tenth PMOS element P10 is turned on by the first buffer signal BS1, the twelfth PMOS element P11 may be turned on.

The eleventh PMOS element P11 may be connected to the ninth NMOS element N9, and the ninth NMOS element N9 may be connected to the eleventh NMOS element N11 receiving the reference voltage VSS. The twelfth PMOS element P12 may be connected to the tenth NMOS element N10, and the tenth NMOS element N10 may be connected to a twelfth NMOS element N12 receiving the reference voltage VSS. The first power supply voltage VDD may be input to gates of the ninth NMOS element N9 and the tenth NMOS element N10. A gate of the eleventh NMOS element N11 may be connected to a node between the tenth NMOS element N10 and the twelfth NMOS element N12, and a gate of the twelfth NMOS element N12 may be connected to a node between the ninth NMOS element N9 and the eleventh NMOS element N11.

Meanwhile, each of the thirteenth NMOS element N13 and the fourteenth NMOS element N14 may receive the first power supply voltage VDD. A gate of the thirteenth NMOS element N13 may be connected to a node between the ninth NMOS element N9 and the eleventh PMOS element P11, and a gate of the fourteenth NMOS element N14 may be connected to a node between the tenth NMOS element N10 and the twelfth PMOS element P12.

The level down shifter circuit according to the example of FIG. 7 may further include a first capacitor C1 and a second capacitor C2. As illustrated in FIG. 7, the first capacitor C1 may be connected to a node between the ninth PMOS element P9 and the eleventh PMOS element P11 and the node between the ninth NMOS element N9 and the eleventh NMOS element N11. Meanwhile, the second capacitor C2 may be connected to a node between the tenth PMOS element P10 and the twelfth PMOS element P12 and the node between the tenth NMOS element N10 and the twelfth NMOS element N12.

As described above, the first buffer signal B S1 and the second buffer signal BS2 may have opposite phases. In other words, the second buffer signal BS2 may be a complementary signal of the first buffer signal BS1. In addition, each of the first buffer signal BS1 and the second buffer signal BS2 may be a signal swinging between the first power supply voltage VDD and the second power supply voltage 2VDD.

As described above, when a level of the second buffer signal BS2 is the first power supply voltage VDD, the ninth PMOS element P9 may be turned on, and the eleventh PMOS element P11 may be turned on. In this case, the tenth PMOS element P10 may be turned off by the first buffer signal BS1 having the level of the second power supply voltage 2VDD. In addition, the thirteenth NMOS element N13 may be turned on to input the first power supply voltage VDD to the gate of the twelfth NMOS element N12, and the twelfth NMOS element N12 may be turned on. Accordingly, a level of the internal input signal IIS output by the level down shifter circuit may be set to the reference voltage VSS.

When the level of the second buffer signal B S2 is the second power supply voltage 2VDD, the ninth PMOS element P9 may be turned off. On the other hand, the tenth PMOS element P10 may be turned on by the first buffer signal BS1 having the level of the first power supply voltage VDD, and the twelfth PMOS element P12 may also be turned on. In addition, the second power supply voltage 2VDD may be input to the gate of the fourteenth NMOS element N14 and be turned on, and the level of the internal input signal IIS may be set to the first power supply voltage VDD. In this manner, a clamp signal CS swinging between the first power supply voltage VDD and the second power supply voltage 2VDD may be converted into an internal input signal IIS swinging between the reference voltage VSS and the first power supply voltage VDD by the level down shifter circuit. In some implementations, such as the examples illustrated in FIGS. 6 and 7, the internal input signal IIS may have the same phase as the first buffer signal BS1 and the clamp signal CS.

Figure 8:
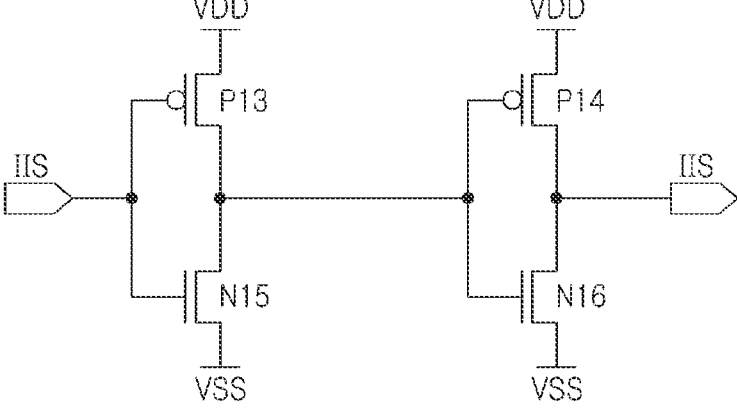

FIG. 8 may be a circuit diagram schematically illustrating the second buffer circuit for receiving the internal input signal IIS from the level down shifter circuit. Referring to FIG. 8, the second buffer circuit may include a plurality of fourth elements P13 to P14 and N15 to N16, and among the plurality of fourth elements P13 to P14 and N1 to N16, the PMOS elements P13 to P14 may receive the first power supply voltage VDD, and the NMOS elements N15 to N16 may receive the reference voltage VSS. As illustrated in FIG. 8, the thirteenth PMOS element P13 and the fifteenth NMOS element N15 may supply the first inverter circuit, and the fourteenth PMOS element P14 and the sixteenth NMOS element N16 may supply a second inverter circuit.

The second buffer circuit may buffer and output the internal input signal IIS and transmit the internal input signal IIS to the core circuit. Unlike the external input signal EIS having the reference voltage VS S as a minimum voltage level and a maximum voltage level higher than the second power supply voltage 2VDD, the internal input signal IIS may be a signal swinging at a level between the reference voltage VSS and the first power supply voltage VDD.

Figure 9:
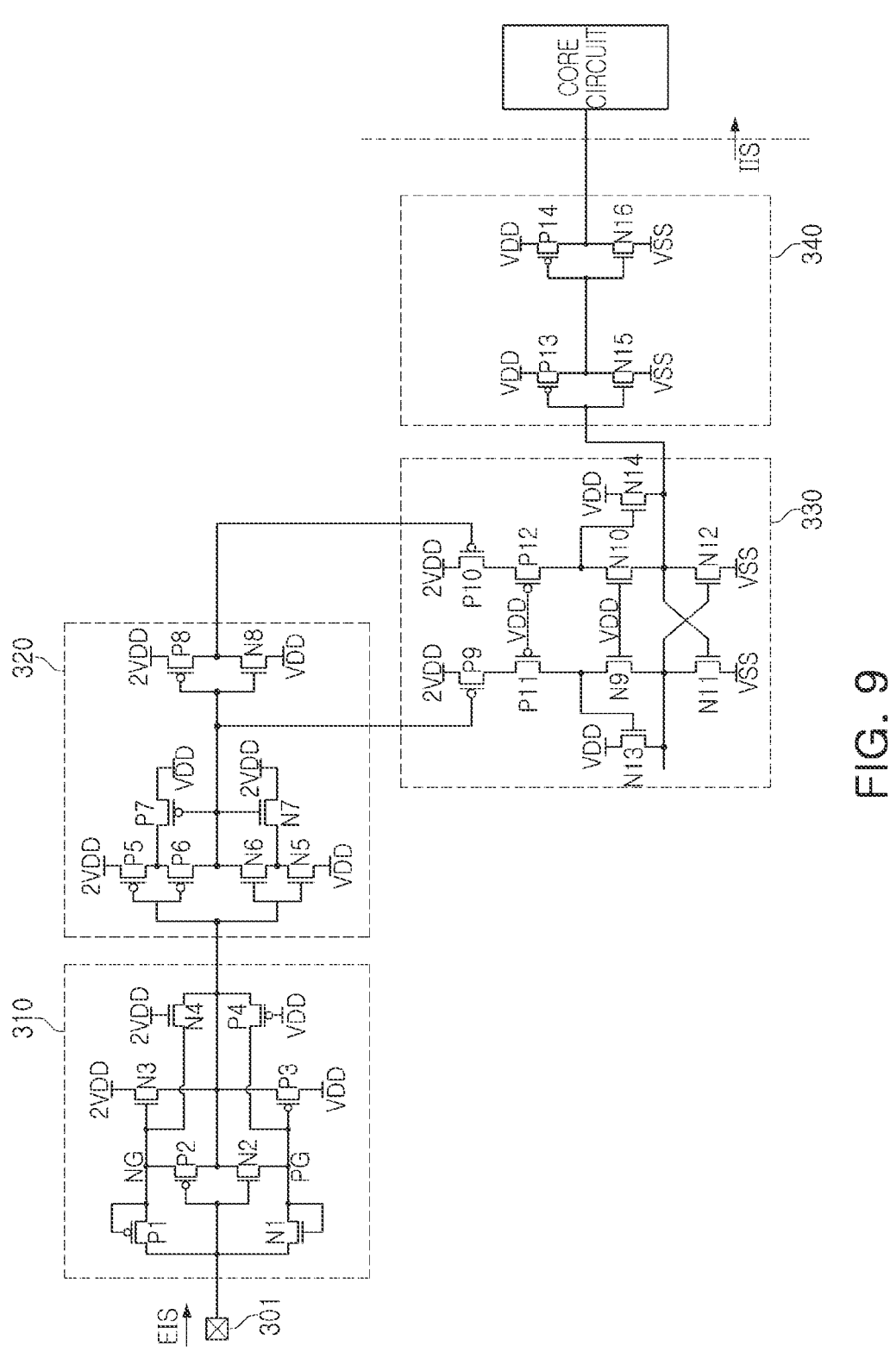

FIG. 9 is a circuit diagram illustrating an example of a receiving circuit included in the semiconductor device according to some implementations of the present disclosure. Referring to FIG. 9, a semiconductor device 300 may include the receiving circuit including a voltage clamping circuit 310, a first buffer circuit 320, a level down shifter circuit 330, and a second buffer circuit 340. The receiving circuit may convert the external input signal EIS received by the input pad 301 into the internal input signal IIS and supply the internal input signal to a core circuit 350.

Each of the voltage clamping circuit 310, the first buffer circuit 320, the level down shifter circuit 330, and the second buffer circuit 340 may be implemented according to the example described with reference to FIGS. 4 to 8. However, at least one of the voltage clamping circuit 310, the first buffer circuit 320, the level down shifter circuit 330, and the second buffer circuit 340 may be implemented in a different structure from the example described with reference to FIGS. 4 to 8. For example, the voltage clamping circuit 310 may be implemented as a Schmitt trigger circuit different from the structure described with reference to FIG. 4.

In addition, according to some implementations of the present disclosure, the circuits 310 to 340 included in the receiving circuit may vary. For example, a clamp signal CS output from the voltage clamping circuit 310 and a signal having an opposite phase to that of the clamp signal CS may be input to the level down shifter circuit 330 without the first buffer circuit 320. In addition, the internal input signal IIS output by the level down shifter circuit 330 may be directly input to the core circuit 350 without the second buffer circuit 340.

Hereinafter, an operation of the receiving circuit included in the semiconductor device 300 according to some implementations of the present disclosure will be described with reference to FIGS. 9 and 10.

Figure 10:
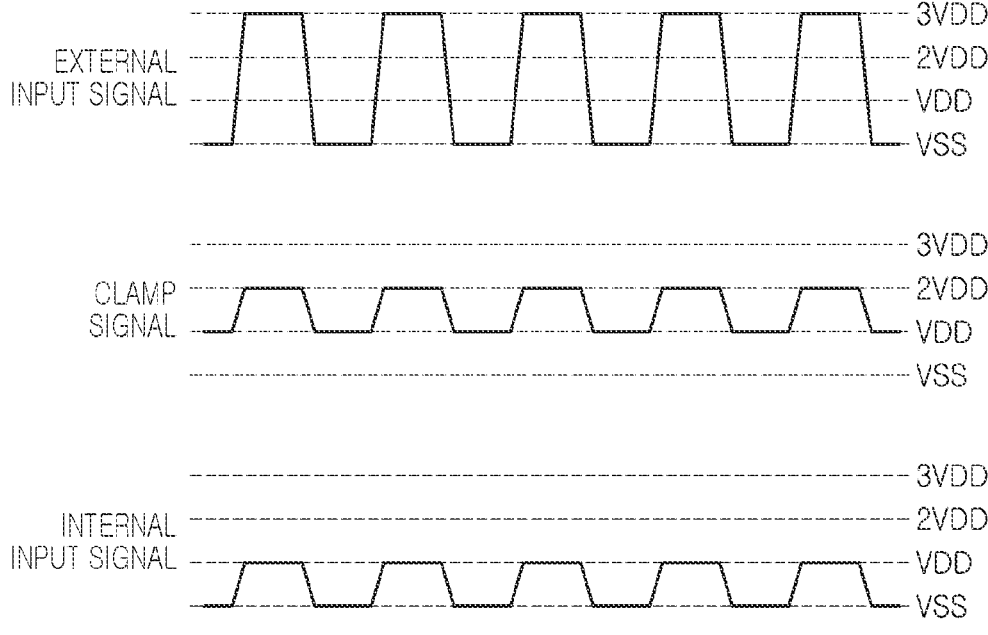
FIG. 10 is a diagram illustrating an operation of a semiconductor device according to some implementations of the present disclosure.

FIG. 10 is a diagram illustrating an operation of a semiconductor device according to some implementations of the present disclosure.

The plurality of elements P1 to P14 and N1 to N16 included in the receiving circuit according to the example described with reference to FIG. 9 may operate upon receiving a voltage within the first power supply voltage VDD. For example, the plurality of elements P1 to P14 and N1 to N16 included in the receiving circuit may operate upon receiving the same power supply voltage as a plurality of elements included in the core circuit 350. Accordingly, the plurality of elements P1 to P14 and N1 to N16 included in the receiving circuit may be formed by the same process as the elements of the core circuit 350, and the number of masks required for the manufacturing process may be reduced to lower the manufacturing costs of the semiconductor device 300 as well as to lower the difficulty of the manufacturing process.

However, as described above, the external input signal EIS input to the input pad 301 of the semiconductor device 300 may be a signal swinging at a maximum level of a voltage that may be input to the plurality of elements P1 to P14 and N1 to N16, that is, at a higher level than the first power supply voltage VDD. For example, referring to FIG. 10, the external input signal EIS input to the receiving circuit may have a swing level higher than that of the first power supply voltage VDD.

According to some implementations illustrated in FIG. 10, the minimum voltage level of the external input signal EIS may be equal to the reference voltage VSS, and the maximum voltage level thereof may be equal to a third power supply voltage 3VDD. The third power supply voltage 3VDD may be three times as high as the first power supply voltage VDD. The swing level of the external input signal EIS may be more than twice the first power supply voltage VDD, and accordingly, when the external input signal EIS is input to the core circuit 350 without change, elements included in the core circuit 350 may be damaged.

According to some implementations of the present disclosure, a receiving circuit for generating the internal input signal IIS by reducing the swing level of the external input signal EIS may be included in the semiconductor device. Accordingly, the semiconductor device 300 may receive a signal having the swing level higher than the level of the power supply voltage at which the elements of the core circuit 350 can withstand, and the universality of the semiconductor device 300 may be improved. In addition, the receiving circuit for processing the external input signal EIS having a relatively higher swing level may be implemented with the elements P1 to P14 and N1 to N16 with gate insulating layers of the same size and thickness as the elements of the core circuit 350, thereby simplifying the manufacturing process of the semiconductor device 300 as well as reducing the manufacturing costs.

Referring to FIGS. 9 and 10, the voltage clamping circuit 310 may receive an external input signal EIS to generate a clamp signal. For example, the voltage clamping circuit 310 may generate the clamp signal by limiting a signal having a level between the reference voltage VSS and the first power supply voltage VDD to the first power supply voltage VDD and limiting a signal having a level between the second power supply voltage 2VDD and the third power supply voltage 3VDD to the second power supply voltage. Accordingly, as illustrated in FIG. 10, the clamp signal may swing between the first power supply voltage VDD and the second power supply voltage 2VDD.

However, the external input signal EIS is not limited to the form illustrated in FIG. 10. For example, the minimum voltage level of the external input signal EIS may be higher than the reference voltage VSS, and the maximum voltage level of the external input signal EIS may be higher than the second power supply voltage 2VDD and lower than the third power supply voltage 3VDD. As described above, since the voltage level between the reference voltage VSS and the first power supply voltage VDD is limited to the first power supply voltage VDD by the voltage clamping circuit 310, and the voltage level between the second power supply voltage 2VDD and the third power supply voltage 3VDD is limited to the second power supply voltage 2VDD, the minimum voltage level and the maximum voltage level of the external input signal EIS are not limited to the reference voltage VSS and the third power supply voltage 3VDD.

The clamp signal may be buffered by the first buffer circuit 320 and input to the level down shifter circuit 330. The level down shifter circuit may output the internal input signal (IIS) whose level is down, in response to the clamp signal and a complementary clamp signal having an opposite phase to that of the clamp signal. The internal input signal IIS may be a signal that reduces the minimum voltage level of the clamp signal from the first power supply voltage VDD to the reference voltage VSS and reduces the maximum voltage level of the clamp signal from the second power supply voltage 2VDD to the first power supply voltage VDD. Accordingly, the core circuit 350 may receive the internal input signal IIS having the same swing level as the first power supply voltage VDD, and the internal elements of the core circuit 350 may not be damaged even though the external input signal EIS has a high swing level.

As shown in FIG. 10, when the external input signal is adjusted to obtain the clamp signal, and when the clamp signal is adjusted to obtain the internal input signal, one or more characteristics of the signals besides magnitude (e.g., frequency, waveform shape, duty cycle, and/or rise time/fall time) may—though need not, in some implementations—be maintained constant and match between original and adjusted signals.

Figure 11:
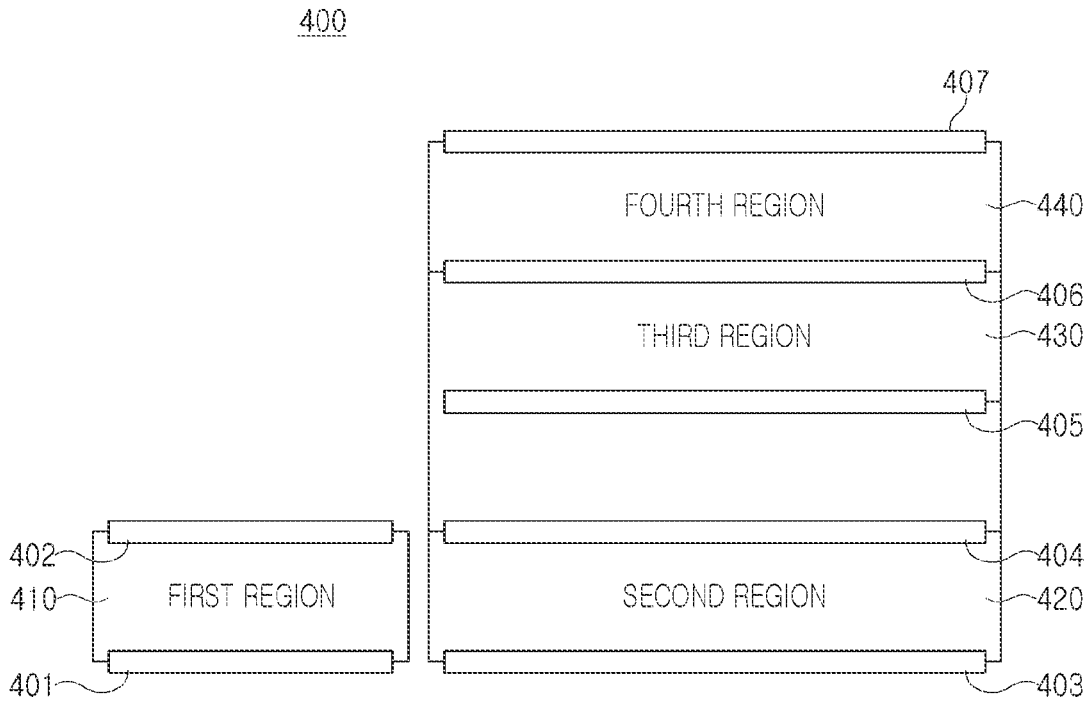
FIGS. 11 and 12 are diagrams schematically illustrating a semiconductor device according to some implementations of the present disclosure.
Figure 12:
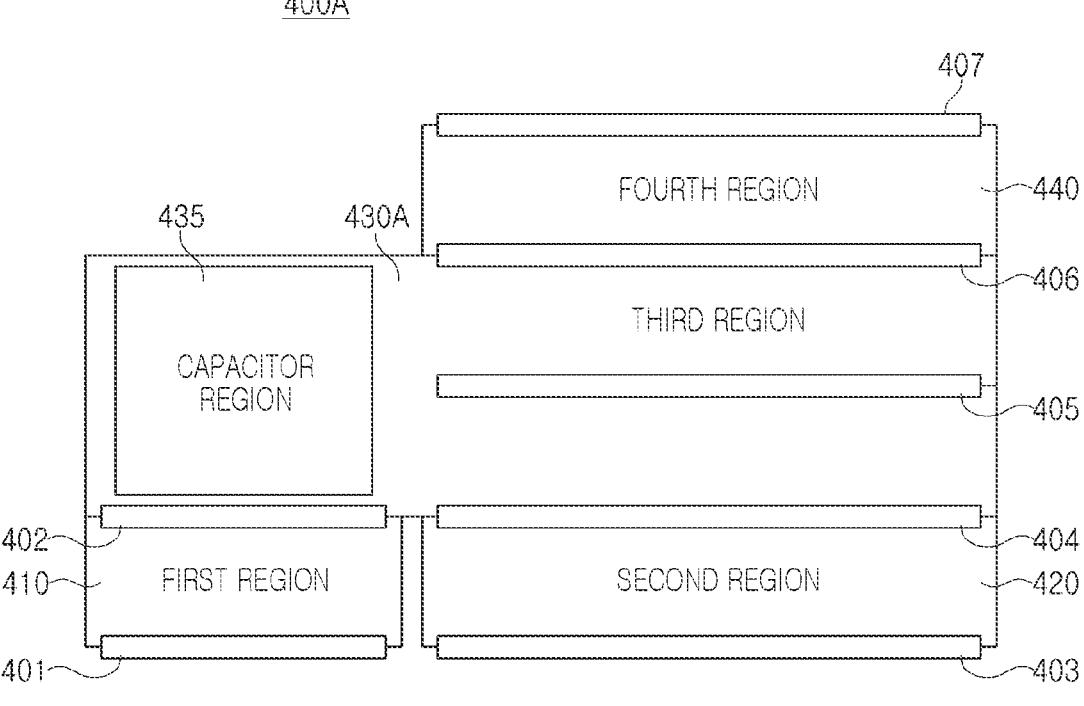

FIGS. 11 and 12 are diagrams schematically illustrating a semiconductor device according to some implementations of the present disclosure.

Referring to FIG. 11, a semiconductor device 400 according to some implementations of the present disclosure may include a plurality of regions 410 to 440, and a plurality of unit circuits included in a receiving circuit may be disposed in the plurality of regions 410 to 440. For example, a voltage clamping circuit may be disposed in the first region 410, a first buffer circuit may be disposed in the second region 420, a level down shifter circuit may be disposed in the third region 430, and a second buffer circuit may be disposed in the fourth region 440.

The first to fourth regions 410 to 440 may be disposed between power lines 401 to 407 configured to supply power supply voltages and a reference voltage. For example, some of the elements included in the voltage clamping circuit may receive the first power supply voltage VDD, and the others thereof may receive the second power supply voltage 2VDD higher than the first power supply voltage VDD. The first region 410 may be disposed between the first power line 401 configured to supply the first power supply voltage VDD and the second power line 402 configured to supply the second power supply voltage 2VDD.

Elements of the first buffer circuit disposed in the second region 420 may also receive the first power supply voltage VDD and the second power supply voltage 2VDD. For example, the first power supply voltage VDD may be supplied to the third power line 403, and the second power supply voltage 2VDD may be supplied to the fourth power line 404. For elements of the level down shifter circuit disposed in the third region 430, some elements may receive the second power supply voltage 2VDD, others elements may receive the first power supply voltage VDD, and the others may receive the reference voltage VSS.

In some implementations illustrated in FIG. 11, the elements disposed in the third region 430 may receive the second power supply voltage 2VDD from the fourth power line 404, and may receive the first power supply voltage VDD through the fifth power line 405. Meanwhile, the reference voltage VSS may be supplied to the sixth power line 406 disposed between the third region 430 and the fourth region 440.

The second buffer circuit disposed in the fourth region 440 may include at least one inverter circuit, and PMOS elements included in the inverter circuit may receive the first power supply voltage VDD, and NMOS elements may receive the reference voltage VSS. Accordingly, in the fourth region 440, the NMOS elements may be disposed adjacent to the sixth power line 406. Meanwhile, the PMOS elements may be disposed adjacent to the seventh power line 407 that supplies the first power supply voltage VDD.

However, the type of voltage supplied to each of the fourth to sixth power lines 404 to 406 may be set differently from the above-described explanation. For example, the second power supply voltage 2VDD may be supplied to the fourth power line 404, the reference voltage VSS may be supplied to the fifth power line 405, and the first power supply voltage VDD may be supplied to the sixth power line 406. In this case, the reference voltage VSS may be supplied to the seventh power line 407, and the PMOS elements included in the second buffer circuit may be disposed adjacent to the sixth power line 406, and the NMOS elements may be disposed adjacent to the seventh power line 407.

According to the example illustrated in FIG. 11, in a semiconductor device 400A, the level down shifter circuit disposed in a third region 430A may include capacitors. For example, the level down shifter circuit including the capacitors may have the same structure as described with reference to FIG. 7. For example, the capacitors included in the level down shifter circuit may be disposed to be adjacent to the first region 410 in a longitudinal direction. Accordingly, as illustrated in FIG. 11, a width of the third region 430A in a horizontal direction may be larger than widths of each of the other regions 410, 420 and 440.

Each of the capacitors disposed in a capacitor region 435 may include some of wiring patterns formed of a conductive material, for example, a metal material. For example, each of the capacitors may include a first electrode and a second electrode, each of the first electrode and the second electrode may include finger-shaped patterns, and the patterns of the first electrode may be disposed to engage with patterns of the second electrode.

The scope of the present disclosure is not limited to the above-described examples and the accompanying drawings. It will be understood by those skilled in the art that various substitutions, modification and changes in form and details may be made therein without departing from the spirit and scope of the present disclosure.

What is claimed is:

1. A semiconductor device comprising:
a voltage clamping circuit including a plurality of first circuit elements configured to operate based on receiving a voltage having a first level,
wherein the voltage clamping circuit is configured to
receive an external input signal having a first swing that is more than twice the first level, and
adjust a voltage of the external input signal to output a clamp signal having a second swing that is less than or equal to the first level;
a first buffer circuit configured to buffer the clamp signal;
a level down shifter circuit configured to
receive an output of the first buffer circuit, a reference voltage, and a first power supply voltage that is higher than the reference voltage, and
based on the output of the first buffer circuit, reduce a voltage of the clamp signal to output an internal input signal having the second swing, the internal input signal swinging between the reference voltage and the first power supply voltage; and
a second buffer circuit configured to buffer the internal input signal and transmit the internal input signal to a core circuit.

2. The semiconductor device of claim 1, wherein the voltage clamping circuit is configured such that
at least one of the plurality of first circuit elements receives the first power supply voltage, and
at least another of the plurality of first circuit elements receives a second power supply voltage that is higher than the first power supply voltage.

3. The semiconductor device of claim 2, wherein the plurality of first circuit elements are electrically disconnected from a reference node that supplies the reference voltage.

4. The semiconductor device of claim 1, wherein the first buffer circuit includes a plurality of second circuit elements, the level down shifter circuit includes a plurality of third circuit elements, and the second buffer circuit includes a plurality of fourth circuit elements, and
each of the plurality of second circuit elements, each of the plurality of third circuit elements, and each of the plurality of fourth circuit elements is configured to operate based on receiving a voltage having the first level.

5. The semiconductor device of claim 4, wherein the first buffer circuit is configured such that
at least one of the plurality of second circuit elements receives the first power supply voltage, and
at least another of the plurality of second circuit elements receives a second power supply voltage that is higher than the first power supply voltage.

6. The semiconductor device of claim 5, wherein the plurality of second circuit elements are electrically disconnected from a reference node that supplies the reference voltage.

7. The semiconductor device of claim 4, wherein the level down shifter circuit is configured such that
a first subset of the plurality of third circuit elements receives the first power supply voltage,
a second subset of the plurality of third circuit elements receives a second power supply voltage that is higher than the first power supply voltage, and
a third subset of the plurality of third circuit elements receives the reference voltage.

8. The semiconductor device of claim 4, wherein the second buffer circuit is configured such that
at least one of the plurality of fourth circuit elements receives the first power supply voltage, and
at least another of the plurality of fourth circuit elements receives the reference voltage.

9. The semiconductor device of claim 1, wherein the clamp signal is a signal swinging between the first power supply voltage and a second power supply voltage that is higher than the first power supply voltage, and
a level difference between the first power supply voltage and the second power supply voltage is equal to a level difference between the reference voltage and the first power supply voltage.

10. The semiconductor device of claim 9, wherein the external input signal swings between the reference voltage and a third voltage that is higher than the second power supply voltage.

11. The semiconductor device of claim 10, wherein a level of the second power supply voltage is twice as high as a level of the first power supply voltage, and
wherein a level of the third voltage is three times as high as the level of the first power supply voltage.

12. A semiconductor device comprising:
a voltage clamp circuit including a plurality of circuit elements configured to operate based on receiving a voltage having a first level, the voltage clamp circuit being configured to
receive an external input signal having a first swing that is more than twice the first level, and
output a clamp signal having a second swing that is less than or equal to the first level by adjusting a voltage level of the external input signal; and
a level down shifter circuit configured to output an internal input signal by adjusting a voltage level of the clamp signal,
wherein a maximum voltage level of the clamp signal is lower than a maximum voltage level of the external input signal,
wherein a minimum voltage level of the clamp signal is higher than a minimum voltage level of the external input signal, and
wherein a swing of the clamp signal is equal to a swing of the internal input signal.

13. The semiconductor device of claim 12, wherein the minimum voltage level of the clamp signal is equal to a maximum voltage level of the internal input signal.

14. The semiconductor device of claim 12, wherein a swing of the external input signal is more than twice the swing of the internal input signal.

15. The semiconductor device of claim 12, further comprising a first buffer circuit configured to buffer the clamp signal and output a first buffer signal and a second buffer signal having an opposite phase to that of the first buffer signal,
wherein the level down shifter circuit is configured to output the internal input signal based on the first buffer signal and the second buffer signal.

16. The semiconductor device of claim 15, wherein the first buffer circuit includes a first inverter circuit configured to receive the clamp signal and a second inverter circuit configured to output the second buffer signal, and
wherein a number of circuit elements included in the first inverter circuit is larger than a number of circuit elements included in the second inverter circuit.

17. The semiconductor device of claim 15, wherein respective numbers of power supply voltages input to each of the voltage clamp circuit and the first buffer circuit is less than a number of power supply voltages input to the level down shifter circuit.

18. A semiconductor device comprising:

a receiving circuit connected to an input pad and configured to receive an external input signal having a first swing that is more than twice a first level through the input pad, and generate an internal input signal having a second swing that is less than or equal to the first level by reducing the first swing of the external input signal and a maximum voltage level of the external input signal; and a core circuit including a plurality of circuit elements configured to operate based on receiving a voltage having the first level, the core circuit being configured to receive the internal input signal, wherein a plurality of transistors included in the receiving circuit and the core circuit include a gate insulating layer having a same thickness, and wherein a maximum power supply voltage that each of the plurality of transistors is configured to receive is less than half the first swing of the external input signal.

19. The semiconductor device of claim 18, wherein the first swing of the external input signal is three times as high as the maximum power supply voltage that each of the plurality of transistors is configured to receive.

20. The semiconductor device of claim 18, wherein the plurality of transistors included in the receiving circuit and the core circuit have a same scale.

\* \* \* \* \*